Figure 3:
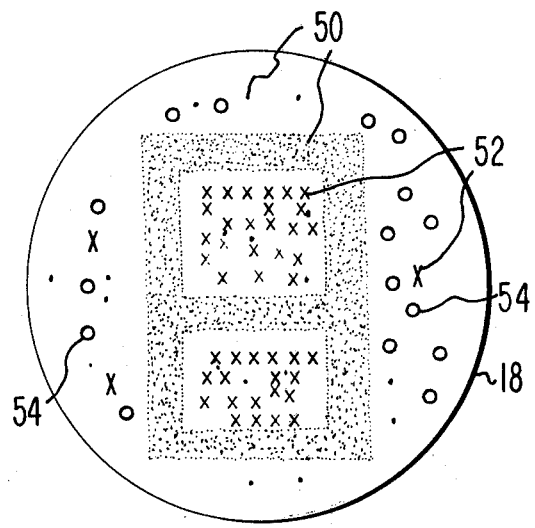

United States Patent [19] [11] 4,074,139
Pankove [45] Feb. 14, 1978

[54] APPARATUS AND METHOD FOR MASKLESS ION IMPLANTATION
[75] Inventor: Jacques Isaac Pankove, Princeton, N.J.
[73] Assignee: RCA Corporation, New York, N.Y.
[21] Appl. No.: 754,685
[22] Filed: Dec. 27, 1976
[51] Int. Cl.² .................. H01J 37/30; H01L 21/72; H01L 21/265
[52] U.S. Cl. ............................... 250/492 A; 148/1.5
[58] Field of Search ................... 148/1.5; 250/492 A
[56] References Cited
U.S. PATENT DOCUMENTS
3,500,042 3/1970 Castaing et al. .................. 250/309
3,866,042 2/1975 Vastel .................................. 250/296

Primary Examiner—Eli Lieberman
Assistant Examiner—Charles F. Roberts
Attorney, Agent, or Firm—H. Christoffersen; R. P. Williams; T. H. Magee

[57] ABSTRACT

A method and apparatus for implanting dopant material into a substrate of semiconductive material in a preselected pattern without utilizing a mask comprises the use of a source template which is formed of the desired dopant material in the configuration of the pattern to be implanted. Ions of the dopant material are sputtered from the template by bombardment with an ionized gas, and these dopant ions are then filtered from unwanted ion species and accelerated into the substrate while remaining in the original template pattern.

7 Claims, 5 Drawing Figures

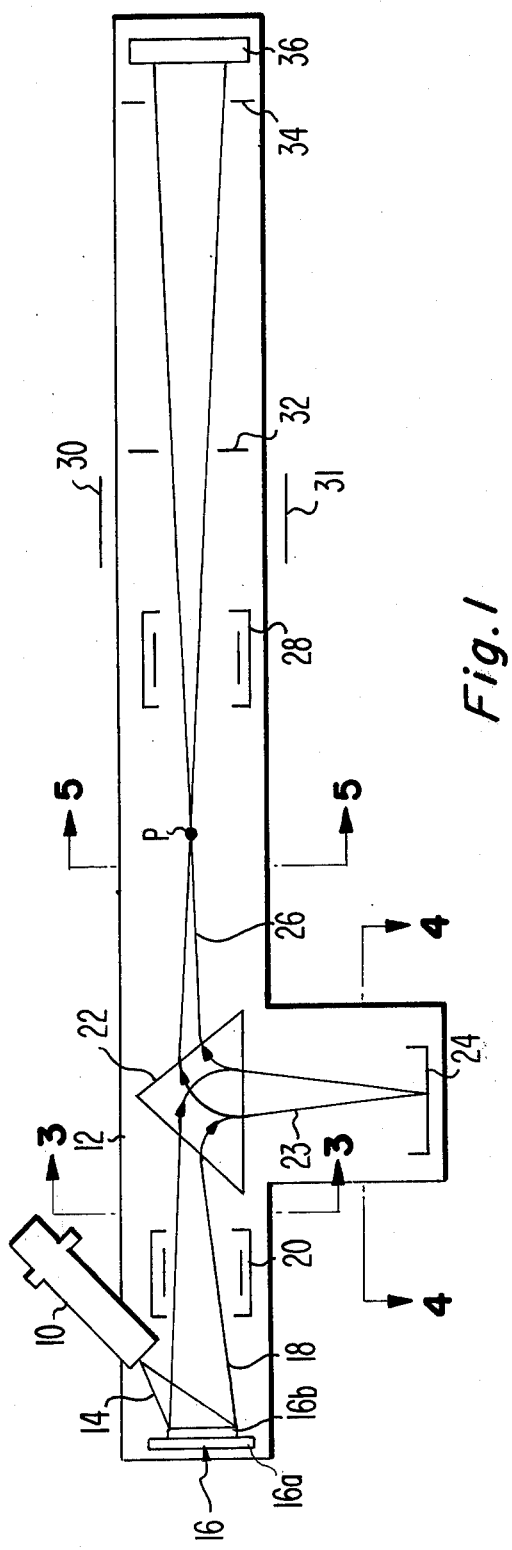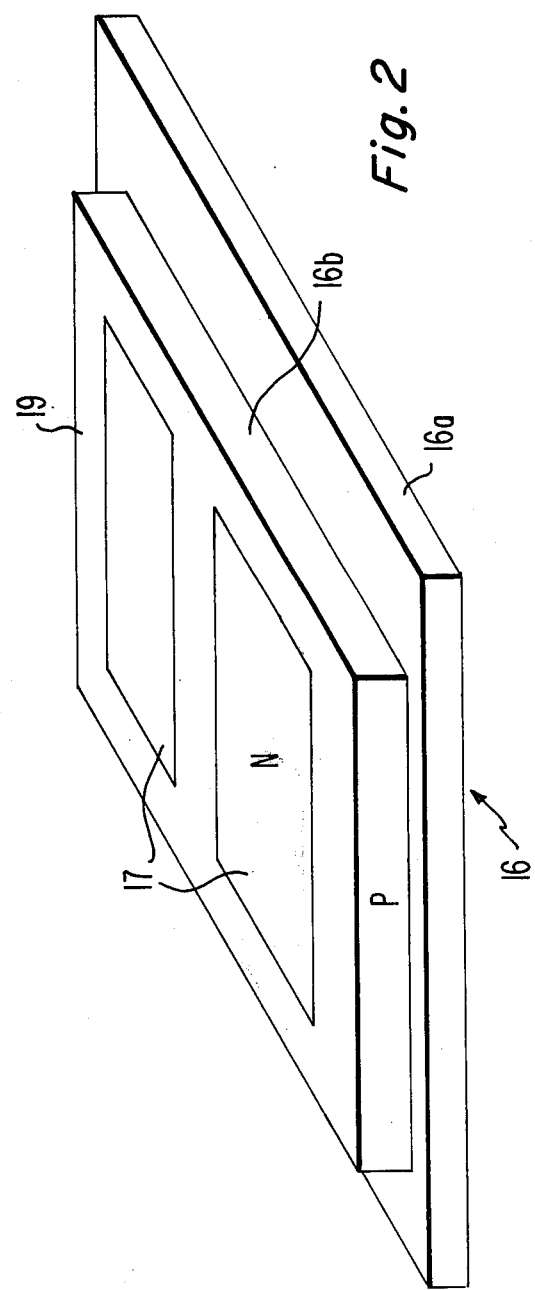

APPARATUS AND METHOD FOR MASKLESS ION IMPLANTATION

The present invention relates to the ion implantation of selected impurities or dopants into a substrate of semiconductive material, the implantation being accomplished without a mask, but in a specified pattern.

In the production of transistors, integrated circuits and like devices, it is generally necessary to introduce dopants or impurities into the crystal structure of a substrate of semiconductive material. These dopants must be introduced in a specific configuration and within very close tolerances. Introducing the impurities in the required patterns and achieving the desired resolution has proven to be a difficult problem. Impurities have been diffused through a mask which has been formed into the desired configuration by photolithographic processes on the surface of the substrate. However, this method allows the dopant to migrate laterally under the mask, thus adversely affecting resolution. The diffusion method also requires multi-step photolithographic operations which are relatively time consuming and expensive. One solution to minimize the adverse resolution obtained by the diffusion method is to introduce impurities by means of ion implantation. With ion implantation, the dopant material is ionized and then accelerated into a target substrate through a mask which defines the desired pattern.

Prior art ion-implantation methods have generally required the use of masks, and it is customary to use an ion beam to implant dopants through a mask situated either directly upon or spaced some distance from the target substrate. Ion implantation with the mask located directly on the substrate, while reducing the lateral migration associated with the diffusion method, still is subject to the costs of the photolithographic process. On the other hand, ion implantation through an apertured mask spaced from the substrate, eliminates the necessity of practicing the costly masking and etching steps; however, new problems are created using this approach. Because of the necessity of providing supports for the mask, certain configurations may not be obtained by use of masks spaced from the target substrate. For example, using a mask which is spaced from the substrate, it is impossible to implant dopants in an annular or other closed-loop pattern in a single step since the supports for the mask will act as a mask in themselves. The prior art has recognized the need for a method of ion implantation which avoids these difficulties and thus, maskless ion implantation systems have been proposed.

In the book "Ion Beams with Application to Ion Implantation" published by John Wiley & Sons, 1973, on page 292, the authors R. Wilson and G. Brewer disclose two prior art maskless approaches to ion implantation. The first approach, called the Programmed Ion Beam Method, uses an electric field to deflect an ion beam in the desired pattern. This approach may be analogized to writing the desired pattern on the substrate using an ion beam as a pencil. The programmed beam method is extremely time consuming, especially when complex circuit patterns must be fashioned. It is desirable to use a process of ion implantation which drives an entire complex ion pattern into a substrate in a single step, i.e., to use a graphic arts analogy, a process equivalent to printing or xerography.

The second so-called maskless approach disclosed by Wilson and Brewer, known as the projected model approach, does not really appear to be maskless at all in that the ion beam is apparently directed through an apertured body. The apertured body acts as a mask since the beam, once it passes through the aperture, bears the shape of the desired pattern. Furthermore, in the projected model approach, the aperture is made larger than the ultimately desired pattern and therefore it is necessary to reduce the pattern to the desired size by means of ion optics. Also, in using the projected model approach, it is difficult to form certain configurations of implanted regions, e.g., those of annular or other closed-loop shapes.

Accordingly, it is desirable to have a truly maskless method of introducing impurities into a body of semiconductive material which eliminates the slow processing times associated with the only known and truly maskless technique.

Figure 4:
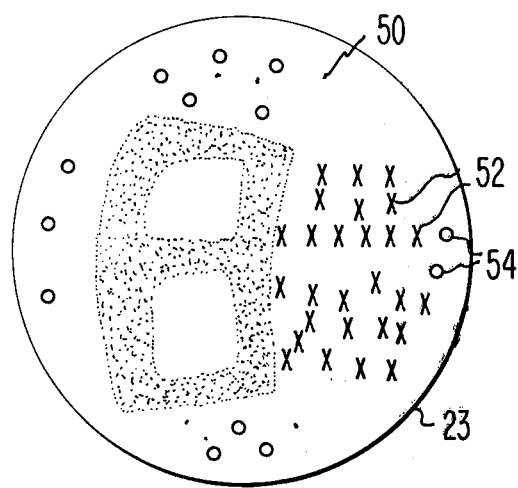
Figure 5:
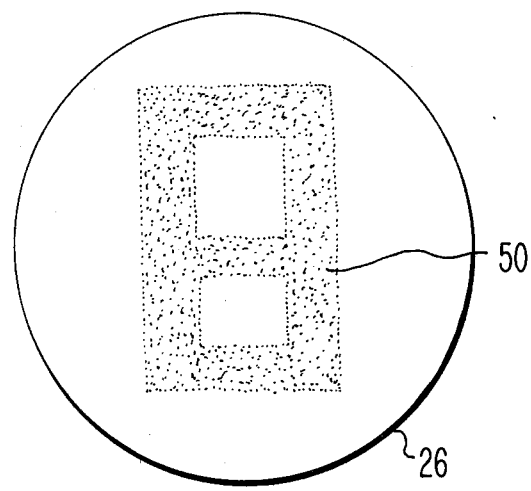

In the Drawing:

FIG. 1 is a schematic diagram illustrating an apparatus for selectively implanting dopant or impurity ions into a substrate of semiconductive material without a mask, FIG. 2 is a perspective view showing a template upon which a pattern of dopant materials have been formed, FIGS. 3 through 5 are cross-sectional views of an ion beam at three different locations 3—3, 4—4, and 5—5, respectively, within the implantation apparatus of the present invention.

FIG. 1 shows an ion implantation apparatus comprising a primary ion source 10 directed toward a source template 16. Also shown is an electrostatic lens 20, an ionic filter comprised of a magnetic prism 22, an electrostatic mirror 24, a second electrostatic lens 28, and an implantation means comprised of a pair of accelerating electrodes 32 and 34, and a target substrate 36 of semiconductive material.

The primary ion source 10 is preferably a plasma generator which is, for example, of the duoplasmatron type. Depending on the gas supplied to the primary ion source 10, various ion species may be emitted, for example $Ar^+$, $O_2^+$ or $O^-$; however, for the purpose of the present invention, I prefer positively charged oxygen ions. The primary ion source 10 is arranged such that ions emanating therefrom emerge into an evacuated chamber 12. These ions form a beam 14 which is directed toward the source template 16. The beam is sufficiently large to completely irradiate the source template.

The source template 16, which is shown in more detail in FIG. 2, is preferably a two-layer structure. The first layer 16a acts as a support for a second layer 16b. The layer 16b, toward which the ion beam 14 is directed, is formed of a material or combination of materials which may act as dopants or impurity materials for the target substrate 36 of semiconductive material. These impurity materials may be selected, for example, from the Group III elements of boron, aluminum, gallium, indium or thallium, or the Group V elements of nitrogen, phosphorus, arsenic, antimony, or bismuth. The particular dopant or impurity materials which comprise the layer 16b of the source template 16 are defined in the pattern in which they are ultimately to be implanted into the target substrate 36 of semiconductive material. For example, P type and N type dopants may be formed in complex patterns such as a pattern resembling a figure eight, which is illustrated in FIG. 2. As shown, layer 16b is comprised of two regions 17 of N type material surrounded by a region 19 of P type material. The pattern in which the dopant or impurity materials are arranged in the layer 16b may be formed, for example, by well known photolithographic processes. The layer 16a of the source template 16 is formed of any material which is not the same as that selected for the dopants to be implanted.

The bombardment of the source template 16 by the primary ion beam 14 is sufficient to cause ions of the dopant material found in the layer 16b to be sputtered from the source template 16 by secondary ion emission. These dopant ions, as well as reflected primary ions and other unwanted impurities, form a beam 18 emanating from the source template 16, as shown in FIG. 1. Dopant ions which have been sputtered from the source template 16 are preferably focused by a first electrostatic lens 20 to form a pattern similar to the pattern in which the dopant is to be implanted on the substrate. In FIG. 3, a representative cross section of the beam 18 (not drawn to scale) which emanates from a source template upon which the specific dopant pattern shown in FIG. 2 has been formed, may be seen. P type dopant ions are represented by dots 50 and N type dopant ions are represented as crosses 52. Reflected primary ions and other unwanted impurities are shown as small circles 54.

The ion beam 18 is directed toward a magnetic prism 22 similar to that described in U.S. Pat. No. 3,500,042 issued to R. Castaing, et al. on Mar. 10, 1970, and U.S. Pat. No. 3,866,042 issued to J. Vastel on Feb. 11, 1975. The magnetic prism 22 is formed in a portion of space within the evacuated chamber 12 and it comprises a uniform magnetic field $B_m$ the magnitude of which is variable. As described in the Castaing patent, the path of a particle entering the magnetic prism 22 will be changed by the field therein, and the particle will follow a curve defined by the following relationship:

$$R = [2m/e]^{1/2} [V/B_m]^{1/2}$$

where $R$ is the radius of curvature, $m$ is the mass, $e$ is the charge, and $V$ is the velocity of the deflected particle. Accordingly, the path of any particle will depend on its mass. Since, as seen from the above equation, the radius of a particle is directly proportional to the square root of its mass, lighter particles will have their paths more greatly deflected than heavier particles.

Emerging from prism 22 is a beam 23 which contains the same ions as that of the beam 18, but whose paths have been deflected by the action of the magnetic prism 22. A representative cross section of the beam 22 may be seen in FIG. 4. There it will be seen that, due to the influence of the magnetic field $B_m$, the lighter P type particles 50 and the heavier N type particles are separated into different regions of the beam 23. It will also be seen that the dopant pattern has been somewhat distorted from that found on source template 16. However, as will be more fully explained below, this distortion is corrected prior to the implantation of the dopant into the target substrate 36.

An electrostatic mirror 24 is positioned at approximately a 90° angle from the axis of the beam 18. The electrostatic mirror 24 is comprised of an electric field having a potential selected such that particles directed toward it, having the charge and mass of the dopant ions, will be reflected back toward the magnetic prism 22. Also, the magnetic flux of the prism 22 is selected such that only the desired dopant species will be deflected toward mirror 24, while lighter and heavier particles will be deflected either too much or too little to impinge on the mirror 24. For purposes of the remaining discussion, it is assumed that the magnetic flux of the prism 22 has been selected such that only P type ions impinge on the mirror 24.

Dopant or impurity ions which impinge on the electrostatic mirror 24 will be reflected back toward the magnetic prism 22 and will then be deflected toward target substrate 36, exiting the prism in an emergent beam 26. A cross section of the emergent beam 26 is shown in FIG. 5. It may be seen from FIG. 5 that only P type ions 50 are present and these ions are arranged in the same configuration as the P type dopant found in the source template 16. Because the ions reflected by the electrostatic mirror 24 pass again through the fields of the magnetic prism 22, the distortion noted above is eliminated in the emergent beam 26. Furthermore, the combination of the magnetic prism 22 and the electrostatic mirror 24 comprises an ionic filter which allows only the desired dopant ions to enter the emergent beam 26. If the distances between the electrostatic lens 20, the prism 22, and the mirror 24 are properly chosen, a dopant ion image will be formed at some point P, which exactly corresponds in size to the dopant pattern which was present on the source template 16. Only dopant ions will be present at point P since only dopant ions were reflected by the mirror 24. Point P is chosen such that it coincides with the focal point of the second electrostatic lens 28. The potential of the lens 28 is chosen such that the dopant ion image formed at Point P is projected onto target substrate 36. The emergent beam 26, after passing through the second lens 28, may be deflected by a transverse external electric field produced on plates 30 and 31, if desired, in order that the beam may be properly positioned.

Finally, the emergent beam 26 is accelerated to a velocity sufficient to allow it to be implanted into target substrate 36 by passing it through an ion implantation means comprised of a longitudinal electric field created by annular accelerating electrodes 32 and 34.

From the foregoing discussion, the flexibility of the disclosed apparatus may be appreciated. For example, it is possible to form a complex dopant pattern on the source template 16, the pattern being comprised of both P type and N type dopants. One type dopant can be implanted and then, by simply adjusting the magnetic flux of the prism 22 and the potential of the mirror 24, the opposite conductivity-type dopant can be implanted without changing the template. In addition, by deflecting the emergent beam 26 by means of the deflection plates 30 and 31, a step and repeat operation may be carried out in which a number of similar patterns may be implanted using only a single source template.

Further, the different dopant species to be implanted need not form isolated patterns on the source template 16, but may overlap in preselected concentrations if it is necessary that more than one dopant species be implanted in a single region of the target substrate 36. Finally, if it is desired that two regions be formed in the target substrate 36 which are of the same dopant type, but which have differing dopant concentrations, separate regions of the source template may also be formed, each having the same dopant therein but of differing concentrations.

What is claimed is:

1. A method of implanting a dopant material into a substrate of semiconductive material in a preselected pattern without utilizing a mask, said method comprising the steps of:
    forming a source template having at least one dopant material formed thereon in said preselected pattern;
    sputtering ions of said dopant material from said template by ion bombardment from a primary ion source;
    filtering said ions of said dopant material from ions of other materials by means of an ionic filter; and
    implanting said ions of said dopant material into said substrate in the pattern of said source template.

2. The method of claim 1, wherein said filtering step is performed by utilizing a magnetic prism in combination with an electrostatic mirror.

3. The method of claim 1, wherein said implanting step comprises the step of accelerating said ions.

4. An apparatus for implanting a dopant material into a substrate of semiconductive material in a preselected pattern without utilizing a mask, said apparatus comprising:
    a source template having at least one dopant material formed thereon in said preselected pattern;
    a means for sputtering ions of said dopant material from said template by ion bombardment from a primary ion source,
    an ionic filter capable of selecting desired dopant ions from ions of other materials; and
    means for implanting said desired dopant ions into said substrate.

5. The apparatus of claim 4, wherein said ionic filter comprises the combination of a magnetic prism and an electrostatic mirror.

6. The apparatus of claim 4 wherein said primary ion source is directed toward template, said primary ions having sufficient energy to induce ions of said dopant material to be sputtered from said template by secondary ion emission.

7. The apparatus of claim 4, wherein said means for implanting comprises an electric field by which said dopant ions are accelerated.

* * * * *